United States Patent
Shakuda

(10) Patent No.: US 8,709,843 B2
(45) Date of Patent: Apr. 29, 2014

(54) METHOD OF MANUFACTURING NITRIDE SEMICONDUCTOR AND NITRIDE SEMICONDUCTOR ELEMENT

(75) Inventor: Yukio Shakuda, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 621 days.

(21) Appl. No.: 12/310,372

(22) PCT Filed: Aug. 23, 2007

(86) PCT No.: PCT/JP2007/066389
§ 371 (c)(1),
(2), (4) Date: Feb. 23, 2009

(87) PCT Pub. No.: WO2008/023774
PCT Pub. Date: Feb. 28, 2008

(65) Prior Publication Data
US 2009/0269867 A1 Oct. 29, 2009

(30) Foreign Application Priority Data

Aug. 24, 2006 (JP) ................. 2006-227621
May 22, 2007 (JP) ................. 2007-135604

(51) Int. Cl.
*H01L 21/00* (2006.01)
(52) U.S. Cl.
USPC .............................. 438/29; 257/78
(58) Field of Classification Search
USPC ................ 257/78, 431, E21.113, E31.04, 257/E31.019; 438/46, 93, 604
See application file for complete search history.

(56) References Cited

U.S. PATENT DOCUMENTS

| | | | | |
|---|---|---|---|---|
| 4,114,226 A * | 9/1978 | Warren | | 15/236.05 |
| 7,498,645 B2 * | 3/2009 | Li et al. | | 257/431 |
| 7,705,371 B2 * | 4/2010 | Nakazawa et al. | | 257/192 |
| 7,811,847 B2 * | 10/2010 | Hirayama et al. | | 438/46 |
| 2001/0009134 A1 * | 7/2001 | Kim et al. | | 117/8 |

(Continued)

FOREIGN PATENT DOCUMENTS

JP 05-109621 4/1993
JP 8008217 B 1/1996

(Continued)

OTHER PUBLICATIONS

Yan et al. ("Surface Smoothing Mechanism of AlN Film by Initially Alternating Supply of Ammonia", Jpn. J. Appl. Phys., vol. 43, No. 8B (2004), Published Jul. 23, 2004).*

(Continued)

*Primary Examiner* — Yu-Hsi D Sun
*Assistant Examiner* — Christina Sylvia
(74) *Attorney, Agent, or Firm* — Rabin & Berdo, P.C.

(57) ABSTRACT

The present invention provides a method of manufacturing a nitride semiconductor capable of improving the crystallinity and the surface state of the nitride semiconductor crystal formed on top of a high-temperature AlN buffer layer. An AlN buffer layer is formed on top of a growth substrate, and then nitride semiconductor crystals are grown on top of the AlN buffer layer. In a stage of manufacturing the nitride semiconductor, the crystal of the AlN buffer layer is grown at a high temperature of 900° C. or higher. In addition, an Al-source material of the AlN buffer layer is started to be supplied first to a reaction chamber and continues to be supplied without interruption, and then a N-source material is supplied intermittently.

7 Claims, 9 Drawing Sheets

(56) References Cited

U.S. PATENT DOCUMENTS

| | | | |
|---|---|---|---|
| 2006/0091500 A1* | 5/2006 | Lee et al. | 257/615 |
| 2006/0160345 A1* | 7/2006 | Liu et al. | 438/604 |
| 2007/0164315 A1* | 7/2007 | Smith et al. | 257/194 |
| 2009/0032833 A1* | 2/2009 | Nam | 257/103 |
| 2010/0133506 A1* | 6/2010 | Nakanishi et al. | 257/13 |
| 2010/0207136 A1* | 8/2010 | Armitage et al. | 257/94 |

FOREIGN PATENT DOCUMENTS

| | | |
|---|---|---|
| JP | 2000-012902 | 1/2000 |
| JP | 2001-302398 | 10/2001 |
| JP | 3478287 B2 | 12/2003 |
| WO | WO 2008047907 A1 * | 4/2008 |

OTHER PUBLICATIONS

Namkoong et al. ("Role of Sapphire Nitridation Temperature on GaN growth by Plasma Assisted Molecular Beam Epitaxy: Part I. Impact of the nitridation chemistry on material characteristics", J. Appl. Phys., vol. 91, No. 4 (2002), Published Feb. 15, 2002).*

Mueller et al. ("Growth of AlGaN/GaN based electronic device structures with semi-insulating GaN buffer and AlN interlayer", Physica Status Solidi C: Conferences and Critical Reviews (2005) 2(7), 2639-2642).*

Losurdo et al. (Role of "Sapphire Nitridation Temperature on GaN growth by Plasma Assisted Molecular Beam Epitaxy: Part II. Interplay between chemistry and structure of layers", J. Appl. Phys., vol. 91, No. 4 (2002), Published Feb. 15, 2002)).*

* cited by examiner

FIG. 5

| | t1 (sec) | W (sec) | TMA (cc/min) | L (sec) | REPETITIONS OF W+L | NH₃ (cc/min) | AℓN FILM THICKNESS (Å) | TEMPERATURE FOR AℓN GROWTH (°C) | SURFACE MORPHOLOGY |
|---|---|---|---|---|---|---|---|---|---|
| EXPERIMENT 1 | 48 | 4.8 | 20 | 51 | 5 | 500 | 65.4 | 1027 | FAVORABLE |
| EXPERIMENT 2 | 48 | 4.8 | 20 | 48 | 2 | 500 | 30.72 | 1041 | UNFAVORABLE |
| EXPERIMENT 3 | 48 | 4.8 | 20 | 51 | 5 | 500 | 65.4 | 1061 | FAVORABLE |
| EXPERIMENT 4 | 48 | 4.8 | 20 | 51 | 5 | 500 | 65.4 | 1006 | FAVORABLE |
| EXPERIMENT 5 | 60 | 4.8 | 20 | 51 | 7 | 500 | 90.12 | 1006 | FAVORABLE |
| EXPERIMENT 6 | 48 | 4.8 | 20 | 51 | 14 | 500 | 165.84 | 1006 | FAVORABLE |
| EXPERIMENT 7 | 15 | 4.8 | 20 | 9 | 1 | 500 | 13 | 910 | FAVORABLE |

| | FULL WIDTH AT HALF MAXIMUM OF X-RAY DIFFRACTION (DEGREE) | |
|---|---|---|
| | AXIAL DIRECTION OF GaN CRYSTAL | |
| | (0001) | (10$\bar{1}$0) |
| LOW-TEMPERATURE GaN BUFFER | 0.0600 | 0.100 |
| AℓN BUFFER (210 Å) | 0.1374 | 0.360 |
| AℓN BUFFER (46 Å) | 0.0922 | 0.227 |
| AℓN BUFFER (13 Å) | 0.1187 | 0.17 |

ND OF MANUFACTURING NITRIDE
METHOD OF MANUFACTURING NITRIDE SEMICONDUCTOR AND NITRIDE SEMICONDUCTOR ELEMENT

TECHNICAL FIELD

The present invention relates to a method of manufacturing a nitride semiconductor including an AlN buffer layer, and also relates to a nitride semiconductor element.

BACKGROUND ART

A lot of development has been made in semiconductor elements made of gallium nitride compound semiconductors, i.e., group-III-V nitride semiconductors (hereafter referred to as nitride semiconductors). Some of the applications of nitride semiconductors are: blue LEDs used as the light sources for illumination, back light or the like; LEDs used for multicoloration; and LDs. The manufacturing of nitride semiconductor in a form of bulk single crystal is difficult. Accordingly, GaN is grown on top of a substrate of different kinds, such as sapphire and SiC, by utilizing the MOCVD (metal organic chemical vapor deposition) method. The sapphire substrate is excellently stable in a high-temperature ammonia atmosphere in the epitaxial growth process, and is especially used as a growth substrate.

The manufacturing of nitride semiconductors by the MOCVD method is carried out, for example, in the following way. Gas of an organic metal compound is supplied, as the reaction gas, to the reaction chamber in which a sapphire substrate is installed as a growth substrate. The temperature for crystal growth is kept at a high temperature of a range approximately from 900° C. to 1100° C. The epitaxial layer of GaN semiconductor crystal is thus grown on top of the sapphire substrate.

However, the GaN semiconductor layer that is grown directly on top of the sapphire substrate by the MOCVD method has a hexagonal pyramid growth pattern or a hexagonal column growth pattern, so that the surface of the GaN semiconductor layer has a myriad of irregularities and has an extremely unfavorable surface morphology. Fabrication of light emitting elements is extremely difficult by use of a crystalline layer of a semiconductor that has an extremely unfavorable surface morphology with a myriad of irregularities formed in its surface, such as above-described one.

In a method used for the purpose of solving the above-described problem, the crystal growth of the nitride semiconductor is preceded by the growth of an AlN buffer layer on top of a growth substrate. Specifically, a low-temperature AlN buffer layer with a film thickness of a range from 100 to 500 Å (angstrom) is formed on top of the growth substrate at a low growth temperature ranging from 400° C. to 900° C. Since GaN is grown on top of the AlN layer that serves as the buffer layer, this method has an advantage of improving the crystallinity and the surface morphology of the GaN semiconductor layer.

According to the above-described method, however, the buffer layer has to be grown under strictly limited conditions. In addition, the film thickness of the buffer layer needs to be strictly set within a very narrow range from 100 to 500 Å. For these reasons, it is difficult to achieve a high yield and, at the same time, the improvement in the crystallinity and the surface morphology of the semiconductor. In short, the method is of little practical use.

Accordingly, a proposal has been made, as described in, for example, Patent Document 1 and Patent Document 2. The proposal is to replace the low-temperature AlN buffer layer with a low-temperature GaN buffer layer that is formed on top of a growth substrate at a low growth temperature ranging from 500° C. to 800° C., and then to grow the nitride semiconductor crystal on top of the low-temperature GaN buffer layer.

Patent Document 1: Japanese Patent No. 3478287
Patent Document 2: JP-B-8-8217

DISCLOSURE OF THE INVENTION

Problems to be Solved by the Invention

The improvement in the crystallinity and the other characteristic of the nitride semiconductor crystal can be expected according to the above-described conventional technique, but the conventional technique has the following problems. In the formation of the nitride semiconductor crystal, which is carried out after the growth of the low-temperature GaN buffer layer, the growth temperature has to be raised up to a high temperature of 1000° C. or higher. As the temperature is rising, the low-temperature GaN buffer layer is being degraded, so that the layer does not serve as a buffer layer any longer. In addition, the temperature thus raised up causes another problem: thermal distortion of the GaN buffer layer that has been formed at a low temperature.

Furthermore, in both cases of the low-temperature GaN buffer layer and of the low-temperature AlN buffer layer, a smaller film thickness of the buffer layer makes it more likely that the crystal axes of the GaN film, the crystal of which is grown on top of the buffer layer, are aligned in the same directions, resulting in better crystallinity of the GaN film. In contrast, as the film thickness becomes smaller, hexagonal facets become more likely to be formed in the surface, and the surface morphology of the GaN film is worsened. A problem is brought about by the use of such a buffer layer in fabricating a device.

A method has already been proposed to address these problems. In the method, a high-temperature AlN buffer layer that is formed at a high temperature of 900° C. or higher is grown on top of a growth substrate, and then a layer of the nitride semiconductor crystal is deposited on top of the AlN buffer layer. The high-temperature AlN buffer layer is, however, is grown under difficult conditions, so that the crystallinity and the surface morphology of the nitride semiconductor crystal deposited on the AlN buffer layer are sometimes worsened. Fabrication of nitride semiconductor crystals of favorable quality is difficult for this reason.

An example of the group-III gas and an example of the group-V gas used in a conventional way of forming a high-temperature AlN buffer layer are trimethylgallium (TMA) and ammonia ($NH_3$), respectively. These source-material gases are supplied to the reaction chamber in accordance with the time chart shown in FIG. 13. To begin with, the supply of TMA is started (ON) at a time point t0, and then the supply of $NH_3$ is started (ON) at a time point t1. Once the supply of TMA and that of $NH_3$ are turned ON, these source-material gases continue to flow until the formation of the high-temperature AlN buffer layer is finished.

A higher mole ratio of $NH_3$/TMA in the high-temperature AlN buffer layer thus formed worsens the flatness of the surface of the nitride semiconductor crystal grown on top of the AlN buffer layer. FIG. 14, which shows the surface of the GaN crystal grown on top of the AlN buffer layer with an $NH_3$/TMA mole ratio of 1800, clearly shows that the surface is rough.

In contrast, a lower mole ratio of $NH_3$/TMA worsens the crystallinity of the nitride semiconductor crystal grown on top of the AlN buffer layer. This worsened state of crystallinity is shown in FIGS. 15 and 16. FIG. 15 shows the state of the surface of the GaN crystal grown on top of the AlN buffer layer, and FIG. 16 shows the state inside the GaN crystal. Note that the mole ratio of $NH_3$/TMA is set at 1200. FIG. 15 clearly shows that the flatness of the surface of the GaN crystal is improved quite well, but FIG. 16 shows that the crystallinity of the GaN crystal is worsened by the Al mixed in the GaN crystal.

In general, as described above, a smaller mole ratio of N-source material/Al-source material of the supplied reaction gas has a negative influence on the crystallinity of the nitride semiconductor crystal formed on top of the AlN buffer layer. In contrast, a larger mole ratio of N-source material/Al-source material worsens the surface morphology of the nitride semiconductor crystal.

The present invention has been made to address the above-described problems and aims to provide a method of manufacturing a nitride semiconductor capable of improving the crystallinity and the surface state of the nitride semiconductor crystal formed on top of a high-temperature AlN buffer layer.

Means for Solving the Problems

To accomplish the above-mentioned object, the invention according to claim 1 provides a method of manufacturing a nitride semiconductor in which a nitride semiconductor crystal is grown on top of an AlN buffer layer. The method is characterized in that the AlN buffer layer is formed by starting supply of an Al-source material at a growth temperature of 900° C. or higher, and then by supplying a N-source material intermittently and continuing to supply the Al-source material without interruption.

The invention according to claim 2 provides the method of manufacturing a nitride semiconductor according to claim 1 characterized in that the AlN buffer layer is formed to have a film thickness of 20 Å or smaller.

The invention according to claim 3 provides the method of manufacturing a nitride semiconductor according to any one of claims 1 and 2 characterized in that the crystal growth of a GaN layer to be formed on top of the AlN buffer layer is carried out at a growth pressure of 150 Torr or higher and a growth temperature of 900° C. or higher.

The invention according to claim 4 provides a nitride semiconductor element in which at least an AlN buffer layer and a GaN layer are formed sequentially on top of a growth substrate. The nitride semiconductor element is characterized in that the AlN buffer layer is formed to have a film thickness of 20 Å or smaller, and so that, in the crystal-growth process of a GaN-based semiconductor layer to be formed on top of the GaN layer, the minimum value of the reflectance oscillation of light from the crystal growth surface is set at 4% or smaller until the sum of the film thickness starting from the semiconductor layer that is next to the growth substrate reaches 1 μm The invention according to claim 5 provides the nitride semiconductor element according to claim 4 characterized in that a GaN-based laminate including the GaN-based semiconductor layer is formed.

Effects of the Invention

According to the present invention, after the supply of the Al (aluminum)-source material of the AlN buffer layer to be formed at a growth temperature of 900° C. or higher is started, the supply of the N (nitrogen)-source material is started. The supply of the N (nitrogen)-source material is carried out intermittently (on-and-off). Accordingly, while the mole ratio of the N-source material/Al-source material is set to be a relatively high value so that Al is prevented from being taken in the crystallinity of the nitride semiconductor crystal, the nitride semiconductor crystal can be formed with a favorable surface morphology.

In addition, the AlN buffer layer is formed at a high temperature of 900° C. or higher. Accordingly, the temperature at the formation of the AlN buffer layer scarcely differs from the temperature for growing the nitride semiconductor crystal the layer of which is to be formed on top of the buffer layer. The growth of the nitride semiconductor crystal can be started quickly, and the degradation of the AlN buffer layer by the heating can be prevented. In addition, the thermal distortion of the AlN buffer layer by the difference in the growth temperature can be prevented.

BRIEF DESCRIPTION OF THE DRAWINGS

FIG. 5 is a chart showing experimental data in accordance with the manufacturing method of the present invention.

Figure 1:
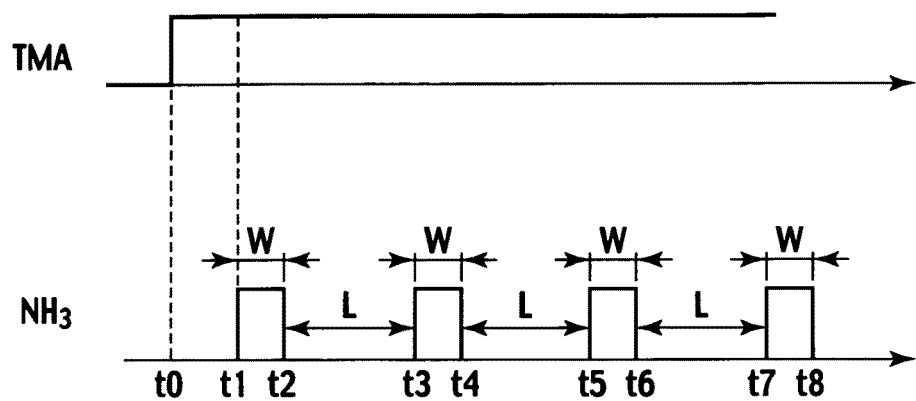
FIG. 1 is a chart for illustrating a method of forming an AlN buffer layer in a method of manufacturing a nitride semiconductor according to the present invention.

DESCRIPTION OF SYMBOLS 1. sapphire substrate
2. AlN buffer layer
3. nitride semiconductor crystal
11. sapphire substrate
12. AlN buffer layer 13. non-doped GaN layer
14. non-doped GaN layer
15. n type GaN layer
16. MQW active layer
17. p type GaN layer
18. transparent electrode
19. p electrode
20. n electrode
31. non-doped GaN layer
32. n type GaN layer
33. MQW active layer
34. p type GaN layer
40. GaN-based laminate

BEST MODES FOR CARRYING OUT THE INVENTION

Figure 2:
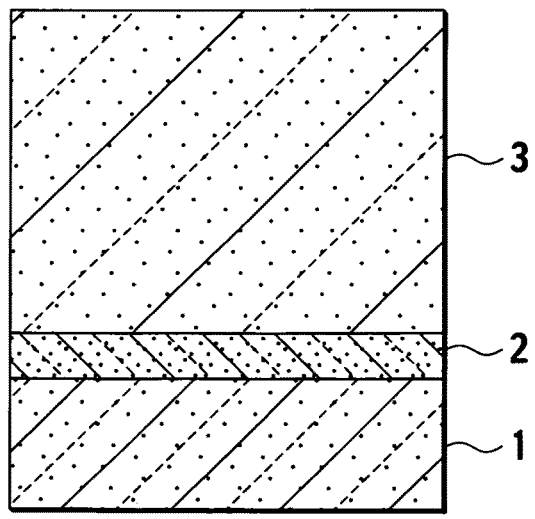
FIG. 2 is a diagram illustrating an overall structure of a nitride semiconductor including an AlN buffer layer.

An embodiment of the present invention will be described below with reference to the drawings. FIG. 1 is a time chart for illustrating principal steps of a method of manufacturing a nitride semiconductor according to the present invention. FIG. 2 illustrates a basic structure of the nitride semiconductor manufactured according to the manufacturing method of the present invention.

An AlN buffer layer 2 is formed on top of a sapphire substrate 1 that serves as a growth substrate, and then a nitride semiconductor crystal 3 is grown on top of the AlN buffer layer 2. This nitride semiconductor is formed by a known method, such as the MOCVD method. Note that the nitride semiconductor crystal 3 represents a quaternary mixed crystal of AlGaInN, what is commonly known as a group III-V nitride semiconductor, and can be expressed as $Al_xGa_yIn_zN$ ($x+y+z=1$, $0 \leq x \leq 1$, $0 \leq y \leq 1$, $0 \leq z \leq 1$).

Some of the characteristic features of the present invention are: the high temperature of 900° C. or higher during the crystal growth of the AlN buffer layer 2; and the intermittent supply of ammonia ($NH_3$) serving as the N-source material for the AlN buffer layer 2 to the reaction chamber while the trimethylgallium (TMA) serving as the Al-source material for the AlN buffer layer 2 has been supplied and continues to be supplied to the reaction chamber without interruption.

Figure 13:
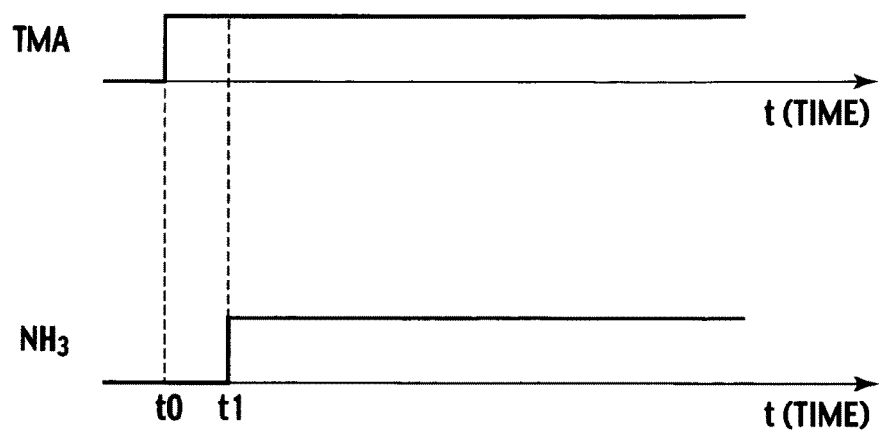
FIG. 13 is a chart for illustrating a conventional method of forming an AlN buffer layer.

As described above, FIG. 13 shows the time chart for the conventional steps of forming the AlN buffer layer. What is common to the conventional manufacturing method and that of the present invention includes: the supply of TMA which precedes the supply of $NH_3$ and which continues without interruption. According to the conventional method, however, $NH_3$ also continues to flow without interruption from the supply start time point t1 till the finishing of the AlN buffer layer formation. This is the point that makes the conventional method completely different from the present invention.

In the time chart shown in FIG. 1, the horizontal axis represents time while the vertical axis represents the ON-OFF status of the supply. According to the present invention, the supply of TMA is firstly started (ON) at a time point t0. TMA continues to be supplied without interruption, as shown in the upper half of FIG. 1, till the formation of the AlN buffer layer 2 with a predetermined film thickness is completed. Subsequently, the supply of $NH_3$ is started at a time point t1. Suppose that the time point t0 is the reference point and that t0=0. Accordingly, the start of the $NH_3$ supply is delayed from the start of the TMA supply by a time length of t1.

After the supply of $NH_3$ continues for a period of W starting from the time point t1 and ending at a time point t2, the supply of $NH_3$ is stopped (OFF), and thus TMA becomes the only raw material that is still supplied. Only TMA is supplied for a period of L starting from the time point t2 and ending at a time point t3. Then, the supply of $NH_3$ is resumed (ON) at the time point t3. Subsequently, $NH_3$ is supplied for a period of W starting from the time point t3 and ending at a time point t4, and then the supply of $NH_3$ is turned OFF at the time point t4. After that, only TMA is supplied for a period of L starting from the time point t4 and ending at a time point t5.

Likewise, $NH_3$ is supplied for the subsequent period of W starting from the time point t5 and ending at a time point t6 and for another period of W starting from a time point t7 and ending at a time point t8. The supply of $NH_3$ is stopped and only TMA is supplied for a period of L starting from the time point t6 and ending at the time point t7. In this way, the supply of $NH_3$ is turned ON only for the periods of W, and thus the supply of $NH_3$ is carried out intermittently. Note that the ON-OFF of the $NH_3$ supply is repeated approximately four times in FIG. 1, but the number of repetitions can be increased or decreased when necessary.

As has been described above, the N (nitrogen)-raw material of AlN is supplied intermittently so that the mole ratio of N-source material/Al-source material can be set to be a relatively high value. Thus, Al is prevented from being taken in the crystallinity of the nitride semiconductor crystal 3, and, in addition, the nitride semiconductor crystal 3 can be formed with favorable surface morphology.

Experiments 1 to 7 shown in FIG. 5 differ from one another in the following variables: the length of time t1 by which the start of the $NH_3$ supply is delayed from the start of the TMA supply when the time point t0=0 in FIG. 1; the duration of the period of W and that of the period of L; the number of repetitions of the ON-OFF cycle for the $NH_3$ supply; the film thickness of AlN; and the temperature for the AlN growth. These variables were set appropriately, and Experiments 1 to 7 were carried out under their respective conditions so as to form the AlN buffer layer 2 on top of the sapphire substrate 1 in each experiment. Then, a layer of non-doped GaN was formed, as the nitride semiconductor crystal shown in FIG. 3, on top of the AlN buffer layer 2. The surface state of this non-doped GaN layer 31 was observed by an AFM or the like. Thus, a determination was made whether the surface morphology of the non-doped GaN layer 31 was favorable or not.

Note that in each of Experiments 1 to 7, the growth pressure was 200 Torr. Hydrogen gas was used as the carrier gas. The flow rate of this carrier hydrogen gas ($H_2$) was 14 L/min. As FIG. 5 shows, the flow rate of TMA was 20 cc/min, and the flow rate of $NH_3$ was 500 cc/min. A value of approximately 2600 is obtained by calculating the $NH_3$/TMA mole ratio in this case.

The temperature for growing the AlN buffer layer in the growth conditions of each of Experiments 1 to 7 was 1000° C. or higher. The surface morphology for each of the series of Experiments 1 to 6 except for Experiment 2 was favorable. The unfavorable surface morphology for Experiment 2 was probably caused by the excessively thin AlN-film thickness of 30.72 Å and by the excessively small number of repetitions for the supply ON-OFF (i.e., the number of repetitions for W+L) as the ON-OFF was repeated only twice.

Figure 4:
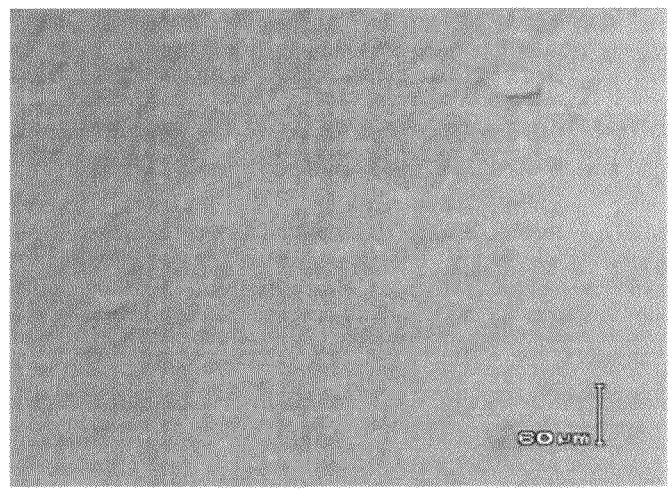
FIG. 4 is a diagram illustrating the surface of the AlN buffer layer formed according to the manufacturing method of the present invention.

Each of Experiment 1 and of Experiment 3 to 7 had a favorable surface morphology of the non-doped GaN layer. FIG. 4 shows an example of data on the surface of the non-doped GaN layer. The surface morphology of the non-doped GaN layer was favorable, so that the flatness thereof was favorable.

Figure 14:
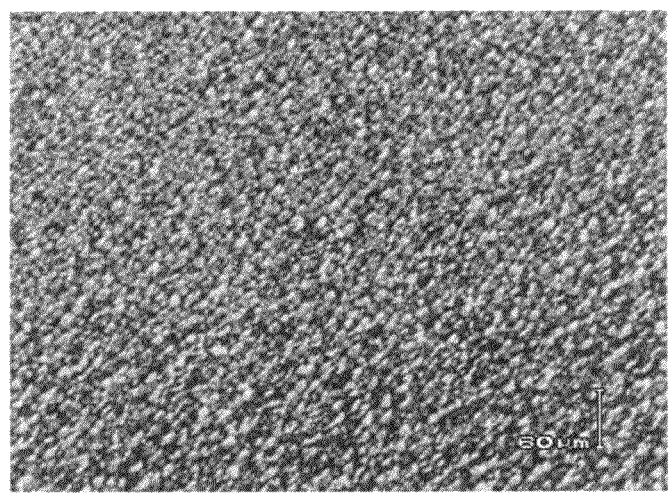
FIG. 14 is a diagram illustrating the surface of the AlN buffer layer formed according to the conventional method.
Figure 15:
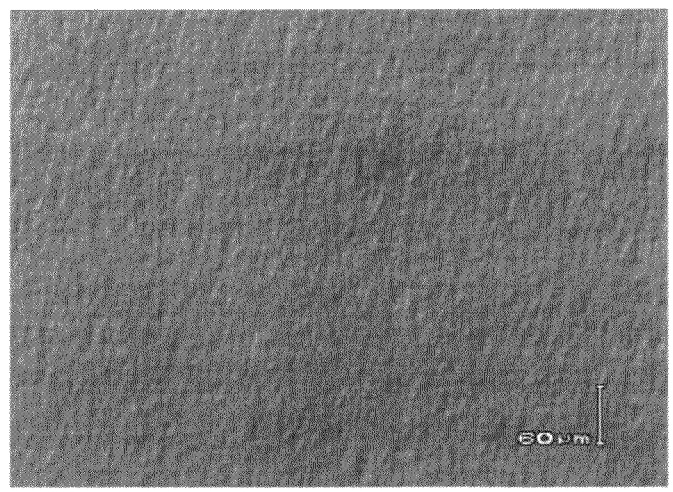
FIG. 15 is a diagram illustrating the surface of a GaN layer deposited on top of the AlN buffer layer formed according to the conventional method.
Figure 16:
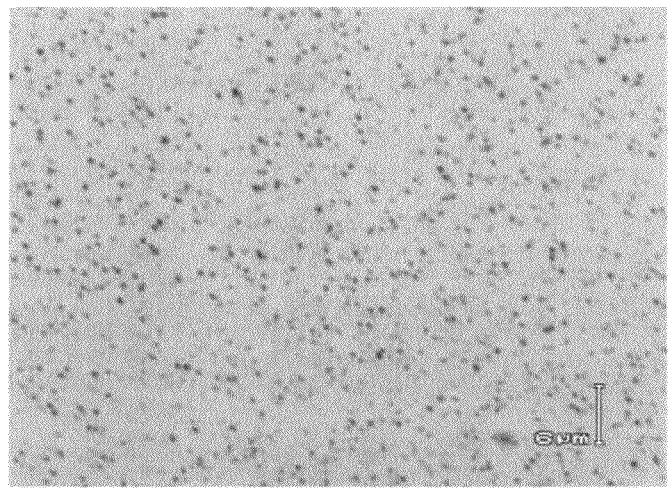
FIG. 16 is a diagram illustrating the state inside the GaN crystal illustrated in FIG. 14.

As described above, the $NH_3$/TMA mole ratio for each of the series of Experiments 1 to 6 is approximately 2600. In each of these Experiments 1 to 6, favorable surface morphology as shown in FIG. 4 was obtained except for a case, such as Experiment 2, where the AlN film thickness is too small and the ON-OFF is repeated only an extremely small number of times. Even when the crystal growth was carried out with a higher mole ratio of the AlN layer than the mole ratio of the AlN layer of FIG. 14 formed according to the conventional method (the mole ratio in this conventional case was 1800), the surface flatness was more favorable, to a satisfactory extent, than the surface flatness in the conventional case.

Incidentally, Experiment 7 differed significantly from Experiments 1 to 6 in some variables. The $NH_3$/TMA mole ratio, the growth pressure, and the like were the same. The duration of the period of W was 4.8 seconds, which was the same as in the cases of Experiments 1 to 6. Meanwhile, the length of time t1 by which the start of the $NH_3$ supply is delayed was 15 seconds. The duration of the time L during which the supply of $NH_3$ was stopped was 9 seconds. The W+L was repeated only once. The film thickness of the AlN buffer layer was 13 Å. In addition, the temperature for growing the AlN buffer layer was 910° C. Also in this case, the surface morphology of the non-doped GaN layer formed on top of the AlN buffer layer was, as described above, favorable.

Figure 3:
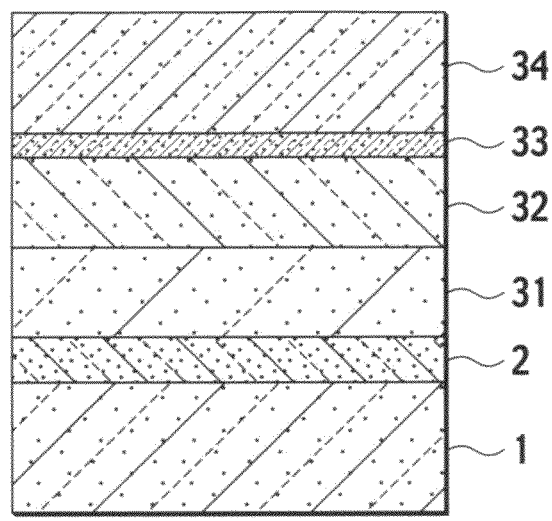
FIG. 3 is a diagram illustrating an example of specific configurations for the nitride semiconductor crystal of FIG. 2.

FIG. 3 shows a specific example of the nitride semiconductor crystal 3 formed on top of the AlN buffer layer 2 of FIG. 2. In FIG. 3, the reference numerals that are identical to those in FIG. 2 represent the identical parts. On top of the AlN buffer layer 2, the non-doped GaN layer 31, a Si-doped n type GaN layer 32, an MQW active layer 33, and a Mg-doped p type GaN layer 34 are formed one upon another in this order. The layers ranging from the non-doped GaN layer 31 to the p type GaN layer 34 are the equivalent to the nitride semiconductor crystal 3 of FIG. 2. The above-mentioned semiconductor layers are formed by the MOCVD method. In addition, the MQW active layer 33 has a multiple quantum well structure including GaN barrier layers and well layers of $In_{X1}Ga_{1-X1}N$ (0<X1).

A method of manufacturing the nitride semiconductor of FIG. 3 will be described next. To begin with, the sapphire substrate 1 serving as the growth substrate is placed in an MOCVD (metal organic chemical vapor deposition) apparatus, and is subjected to thermal cleaning under a continuous flow of hydrogen gas and at a temperature raised up to approximately 1050° C. While the temperature is kept at that temperature or is lowered down to an appropriate temperature of 900° C. or higher, the high-temperature AlN buffer layer 2 is made to grow. The conditions under which this high-temperature AlN buffer layer 2 is grown may be selected appropriately from the experiment data shown in FIG. 5. As FIG. 1 shows, the high-temperature AlN buffer layer 2 is formed in accordance with at least the following procedure. The reaction gas serving as the Al-source material (for example, TMA) is supplied to the reaction chamber in advance and continues to be supplied thereto without interruption, and then the reaction gas serving as the N-source material (for example, $NH_3$) is intermittently supplied to the reaction chamber.

Subsequently, the growth temperature is set in a range from 1020° C. to 1040° C., and the supply of TMA is stopped. Then, the non-doped GaN layer 31 is formed by supplying, for example, trimethylgallium (TMGa) at a flow ratio of 20 μmol/min. After that, the n type GaN layer 32 is grown by supplying silane ($SiH_4$) serving as the n type dopant gas. Subsequently, the supply of TMGa and the supply of silane are stopped. The temperature of the substrate is lowered down to a temperature between 700° C. and 800° C. in a mixed atmosphere of ammonia and hydrogen. Then, an InGaN well layer of the MQW active layer is formed by supplying trimethylindium (TMIn) at a flow rate of 200 μmol/min and triethylgallium (TEGa) at a flow rate of 20 μmol/min. Then, only the supply of the TMIn is stopped, and thus the un-doped GaN barrier layer is formed. Thereafter, the formation of the GaN barrier layer and the InGaN well layer are repeated so as to form the multiple quantum well structure.

After the growth of the MQW active layer 33, the growth temperature is raised up to a temperature in a range from 1020° C. to 1040° C. Then, the p type GaN layer 34 is grown by supplying, for example, trimethylgallium (TMGa) serving as the Ga-atom source-material gas, ammonia ($NH_3$) serving as the N-atom source-material gas, and $CP_2Mg$ (bis-cyclopentadienyl magnesium) serving as the doping material of p type impurity Mg.

The semiconductor layers can be formed with their respective desired compositions, with the desired respective conductivity-types, and in their respective desired thicknesses by supplying necessary gases together with hydrogen or nitrogen serving as a carrier gas and by growing the crystals of the layers sequentially at a temperature range approximately from 700° C. to 1200° C. The necessary gases include: reaction gases corresponding to the contents of the semiconductor layers, such as triethylgallium (TEGa), trimethylgallium (TMG), ammonia ($NH_3$), trimethylaluminum (TMA), and trimethylindium (TMIn); silane ($SiH_4$) serving as the dopant gas to form an n type semiconductor layer; and $CP_2Mg$ (cyclopentadienyl magnesium) serving as the dopant gas to form a p type semiconductor layer.

As described above, when the formation of the AlN buffer layer 2 is followed by the growth of the non-doped GaN layer 31, the temperature for growing the AlN buffer layer 2 may preferably be set from 1000° C. to 1100° C. Since the crystal growth of the non-doped GaN layer 31 can be carried out also at a temperature in a range from 1000° C. to 1100° C. as the experiment data of FIG. 5 shows, the growth of non-doped GaN layer 31 can be started quickly with little need of changing the growth temperature. In addition, the degradation of the AlN buffer layer 2 by heating can be prevented. Moreover, thermal distortion of the AlN buffer layer 2 by the difference in the growth temperature can be prevented.

Figures 6, 7:
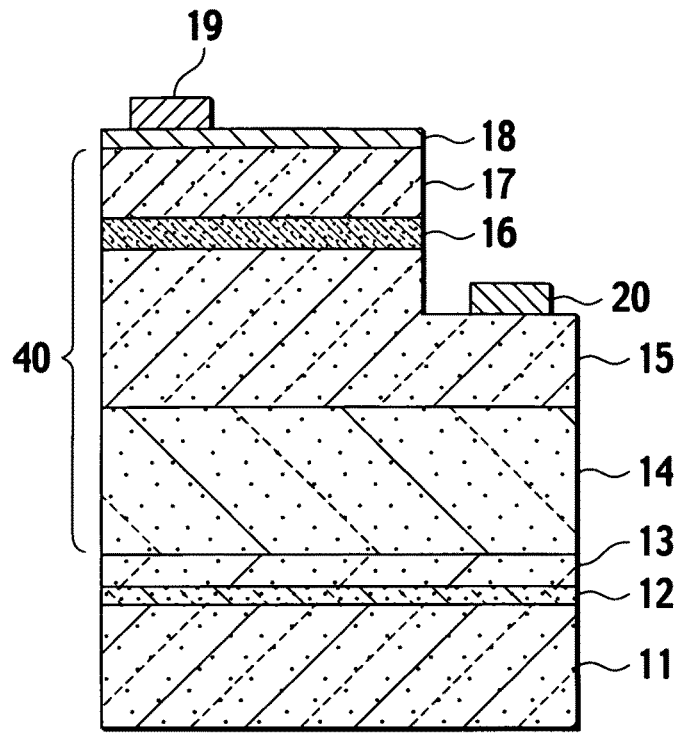
FIG. 6 is a diagram illustrating an example of the configuration for a nitride semiconductor element including the AlN buffer layer of the present invention.
FIG. 7 is a chart showing the relationship between the film thickness of the AlN buffer later and the crystallinity of a GaN film formed on top of the AlN buffer layer.

Subsequently, a nitride semiconductor element is formed on the basis of the results of Experiment 7 shown in FIG. 5 in the following way. As FIG. 6 shows, an AlN buffer layer 12 is formed in a film thickness of 13 Å on top of a sapphire substrate 11 serving as a growth substrate. A non-doped GaN layer 13 is formed thinly on top of the AlN buffer layer 12. Crystals included in a GaN-based laminate 40 are grown on top of this non-doped GaN layer 13. The GaN-based laminate 40 formed on top of the non-doped GaN layer 13 includes: a non-doped GaN layer 14; an n type GaN layer 15; an MQW active layer 16; and a p type GaN layer 17. In addition, a transparent electrode 18 is formed on top of the p type GaN layer 17, and a p electrode 19 is formed on top of the transparent electrode 18. In the meanwhile, the n type GaN layer 15 is exposed by mesa etching, and an n electrode 20 is formed on the exposed surface of the n type GaN layer 15.

A method of manufacturing the nitride semiconductor element of FIG. 6 will be described next. To begin with, the sapphire substrate 11 serving as the growth substrate is placed in an MOCVD (metal organic chemical vapor deposition) apparatus, and is subjected to thermal cleaning under a continuous flow of hydrogen gas, at a temperature raised up to approximately 1000° C. and at a pressure of 55 Torr. Then, the temperature is lowered down to 990° C., the high-temperature AlN buffer layer 2 is made to grow at a pressure of 200 Torr. The conditions under which this high-temperature AlN buffer layer 12 is grown are based on the date for Experiment 7 shown in FIG. 5. The AlN buffer layer 12 is formed so as to have a film thickness of 13 Å.

After the formation of the high-temperature AlN buffer layer 12, the supply of TMA is stopped. While ammonia is being supplied, the growth temperature is set at 900° C. or higher (for example, at 930° C.), and the pressure is set at 150 Torr or higher (for example, at 200 Torr). The non-doped GaN layer 13 is grown in 0.02 μm by supplying, for example, trimethylgallium (TMGa) at a flow rate of 20 μmol/min. The pressure for growing the crystal of the GaN layer on top of the high-temperature AlN buffer layer 12 is thus set at 150 Torr or higher for the purpose of making the seed for growth larger through a three-dimensional crystal growth. Meanwhile, the growth temperature is thus set at 900° C. or higher because a too low growth temperature worsens the crystallinity of GaN.

Subsequently, the non-doped GaN layer 14 is formed in 2.5 μm at a growth temperature from 1020° C. to 1040° C. After the non-doped GaN layer 13 functions to make the seed of the crystal growth larger three-dimensionally, the non-doped GaN layer 14 serves as the transition means to a flat film growth (to a two-dimensional growth). The temperature for growing the non-doped GaN layer 14 is preferably larger than the temperature for growing the non-doped GaN layer 13 while the pressure for growing the non-doped GaN layer 14 is preferably smaller than the pressure for growing the non-doped GaN layer 13.

Then the semiconductor layers ranging from the n type GaN layer 15 to the p type GaN layer 17 are formed in the same way in which the n type GaN layer 32 to the p type GaN layer 34 in FIG. 3, so that no description will be given here. The n type GaN layer 15 is grown in a thickness of 1.5 μm, the MQW active layer 16 is grown in a thickness of 0.1 μm, and the p type GaN layer 17 is grown in a thickness of 0.2 μm After the GaN-based laminate 40 is formed as described above, mesa etching is carried out to expose a part of the n type GaN layer 15. The n electrode 20 is formed on the surface thus exposed. On the other hand, since the top surface of the p type GaN layer 17 is located in the same direction as the direction in which the light is extracted, the transparent electrode 18 is formed on the top surface. The p electrode 19 is formed on top of the transparent electrode 18.

The transparent electrode 18 has a metal multilayer film structure of Ni/Au/Ti/Al/Ni, and the films in the transparent electrode 18 are formed in the thicknesses respectively of 30 Å/40 Å/10 Å/160 Å/15 Å, respectively. Each of the p electrode 19 and the n electrode 20 has an Al/Ni metal multilayer film structure. The films in each electrode is formed in 3000 Å/500 Å.

Figure 8:
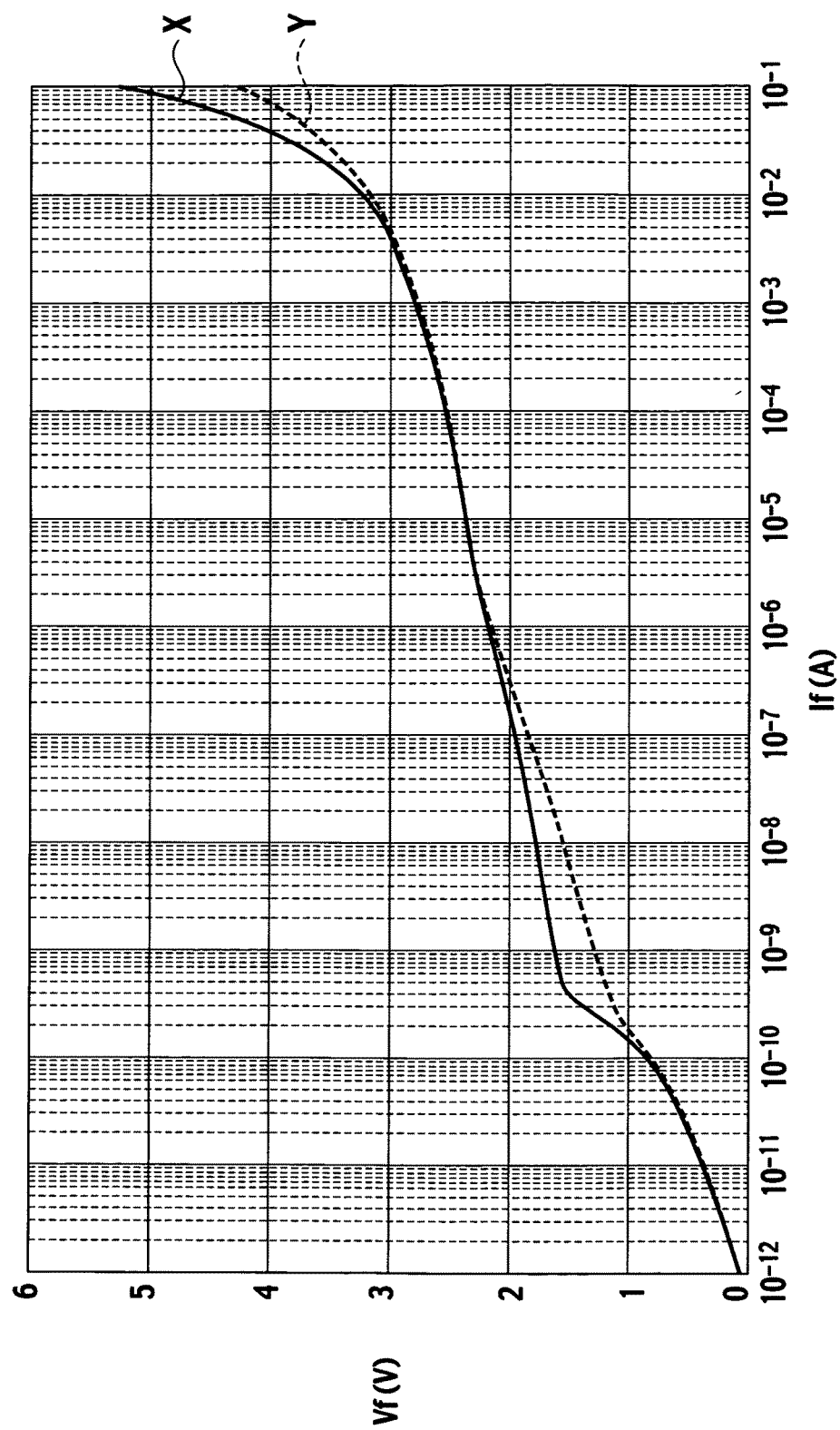
FIG. 8 is a chart illustrating the voltage-current characteristics of the nitride semiconductor element of FIG. 6.

The structure of FIG. 6 is one for a light-emitting diode. FIG. 8 shows the voltage-current characteristics examined while a voltage is applied to both the p electrode 20 and the n electrode 20 and a current is made to flow through the light-emitting diode of FIG. 6. In FIG. 8, the horizontal axis represents the current (If: the unit for the current is ampere), and the vertical axis represents the voltage (Vf: the unit for the voltage is volt). In addition, X (solid line) represents the voltage-current characteristics of the light-emitting diode with the configuration of FIG. 6, and Y (dot line) represents the characteristics measured by replacing the AlN buffer layer 12 in the configuration of FIG. 6 with a low-temperature GaN buffer layer with a film thickness of approximately 100 Å.

Comparison of the curve X with the curve Y in FIG. 8 reveals that X and Y are located at the same position or X is positioned above Y. The fact that X is positioned above Y means that the current value of Y is lower than the current value of X when the same voltage is applied. To put it differently, the fact that X is positioned above Y means that more leak current takes place. Since the GaN buffer layer is made to serve as the buffer layer, coarse surface occurs for each layer of the GaN-based laminate formed above the GaN buffer layer so as to increase the leak current. It is shown that, when the AlN buffer layer is used, the current leak becomes smaller, especially in the low-current range (a range from $10^{-10}$ A to $10^{-7}$ A).

FIG. 7 shows the examination results of how the crystal of the non-doped GaN layer 13 formed on top of the AlN buffer layer is changed by the film thickness of the AlN buffer layer 12 formed on top of the sapphire substrate 11 shown in FIG. 6, for example. The crystal of the non-doped GaN layer 13 was grown while the film thickness of the AlN buffer layer 12 was changed. Then, the surface of the non-doped GaN layer 13 was scanned by an X-ray diffractometer, and the spectrum thus obtained was analyzed. The crystallinity was determined by measuring the full width at half maximum of the spectrum. The AlN buffer layer of a 13-Å film thickness was formed under the growth conditions of Experiment 7 shown in FIG. 5. The AlN buffer layer of a 46-Å film thickness was formed under the same growth conditions as those of Experiment 7 except that the growth temperature was set at 930° C., t1 was set at 18 seconds, and W was set at 450 seconds. In addition, the AlN buffer layer of a 46-Å film thickness was formed under the same growth conditions as those of Experiment 7 except that the growth temperature was set at 930° C., t1 was set at 24 seconds, W was set at 2.6 seconds, L was set at 7.2 seconds, and W+L was repeated 8 times.

The measurement of the full width at half maximum of X-ray diffraction was carried out for two different directions by changing the growth direction of the non-doped GaN layer 13. The direction (0001) represents the c-axis direction, and the direction (10-10) represents the m-axis direction. These growth directions was accomplished by making C-plane {0001} be the principal plane for growth of the sapphire substrate serving as the growth substrate or by making the M-plane {10-10} be the principal plane for the growth. In addition, the crystallinity of a comparative example was measured. In the comparative example, a low-temperature GaN buffer layer of an approximately 100-Å film thickness was used in place of the AlN buffer layer 12, and the crystal of the non-doped GaN layer 13 was grown on top of this low-temperature GaN buffer layer. Both of the values of the crystallinity in the case of using the low-temperature GaN buffer layer of the comparative example are favorable because the crystal axes of the non-doped GaN layer were aligned in the similar directions. The comparative example, however, had a problem of an increase in the current leaking as shown by the curve Y in FIG. 8.

With respect to the examples using the AlN buffer layer, the full width at half maximum of X-ray diffraction is shown for each of three different cases: the AlN buffer layer has a 210-Å film thickness; the AlN buffer layer had a 46-Å film thickness; and the AlN buffer layer had a 13-Å film thickness. When C-plane, which is a polar plane, was the principal plane for growth, the highest crystallinity was obtained in the case where the AlN buffer layer had a 46-Å film thickness. In contrast, when M-plane, which is a non-polar plane, was the principal plane for growth, the highest crystallinity was obtained in the case where the AlN buffer layer had a 13-Å film thickness. In the meanwhile, when the voltage-current characteristics were measured with a 46-Å AlN buffer layer 12 in the configuration of FIG. 6, the voltage-current characteristic thus obtained was approximately similar to that shown by Y in the graph of FIG. 8 employing the low-temperature GaN buffer layer, though the result is not illustrated in FIG. 8. Accordingly, it can be estimated that the GaN-based laminate 40 had a coarse surface, so that the current leaking was not reduced.

On the other hand, when the AlN buffer layer has a 13-Å film thickness, the current leaking was reduced in the low-current range as shown by X in FIG. 8, and thus a favorable device can be fabricated. As has been described above, as long as the film thickness of the AlN buffer layer is kept at 20 Å or smaller, the GaN-based semiconductor layer surface can be formed so as to make the surface not coarse but mirror-finished (reducing the current leaking), and the crystallinity can be improved. Small current leaking in the low-current range can bring about an improvement in the service life of the device and in the electrostatic breakdown voltage.

Figure 10:
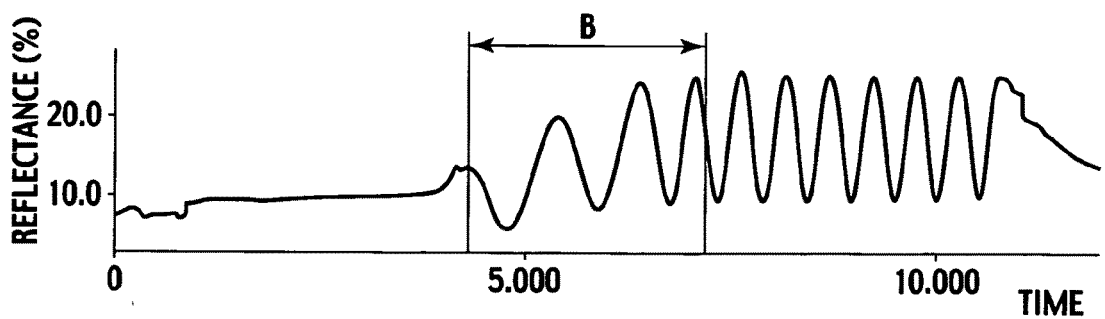
FIG. 10 is a chart illustrating the reflectance change in the growing process of the GaN layer in the case where the AlN buffer layer has a film thickness of 46 Å.
Figure 11:
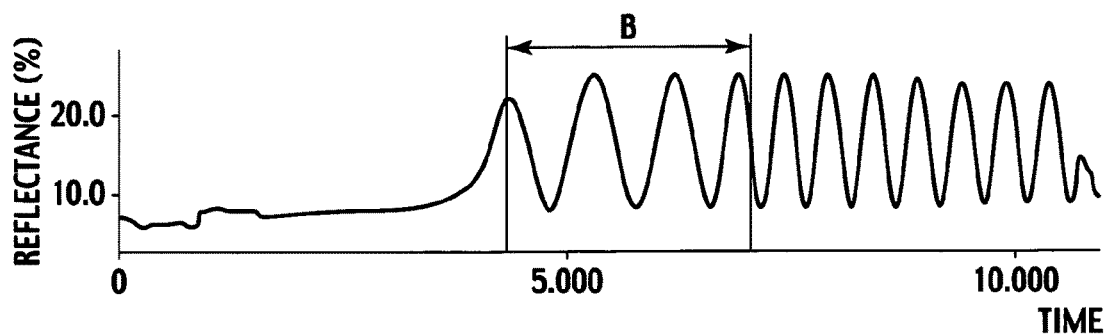
FIG. 11 is a chart illustrating the reflectance change in the growing process of the GaN layer in the case where the AlN buffer layer has a film thickness of 67 Å.
Figure 12:
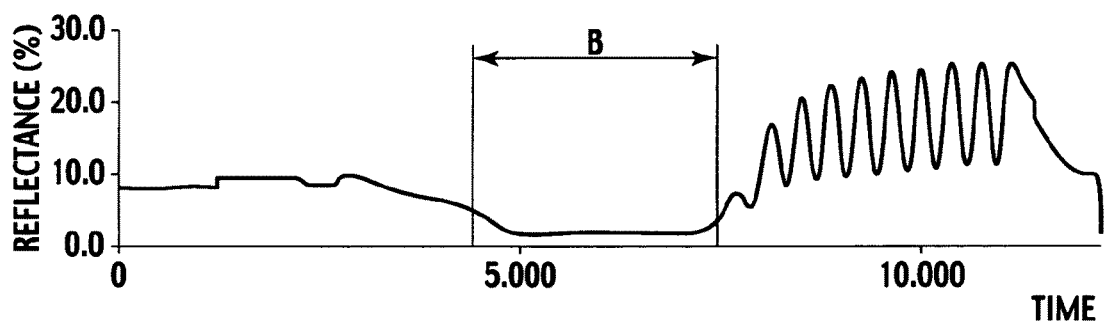
FIG. 12 is a chart illustrating the reflectance change in the growing process of the GaN layer in the case where the AlN buffer layer has a film thickness of 13 Å.

Then, with the configuration of FIG. 6, infrared rays are radiated on the surfaces of the semiconductor layers that are grown while the crystals of the AlN buffer layer 12, the non-doped GaN layer 13, and the GaN-based laminate 40 are being grown. The reflectance of each of the surfaces was measured. FIGS. 10 to 12 show the reflectance with the vertical axis and time (second) with the horizontal axis. Specifically, an optically-transmissive window was formed in the upper portion of the growth chamber of the MOCVD apparatus. The reflectance was measured by disposing an infrared LED and an infrared detector in the vicinity of this window. When the infrared LED was made to emit light with this configuration, the infrared rays passed through the window and hit the wafer placed in the growth chamber and in the midst of the crystal growth. The infrared rays reflected off the wafer were detected by the infrared detector disposed in the vicinity of the window. Then, the reflectance was calculated on the basis of the proportion of the amount of light emitted by the infrared LED to the amount of infrared rays detected by the infrared detector.

Figure 9:
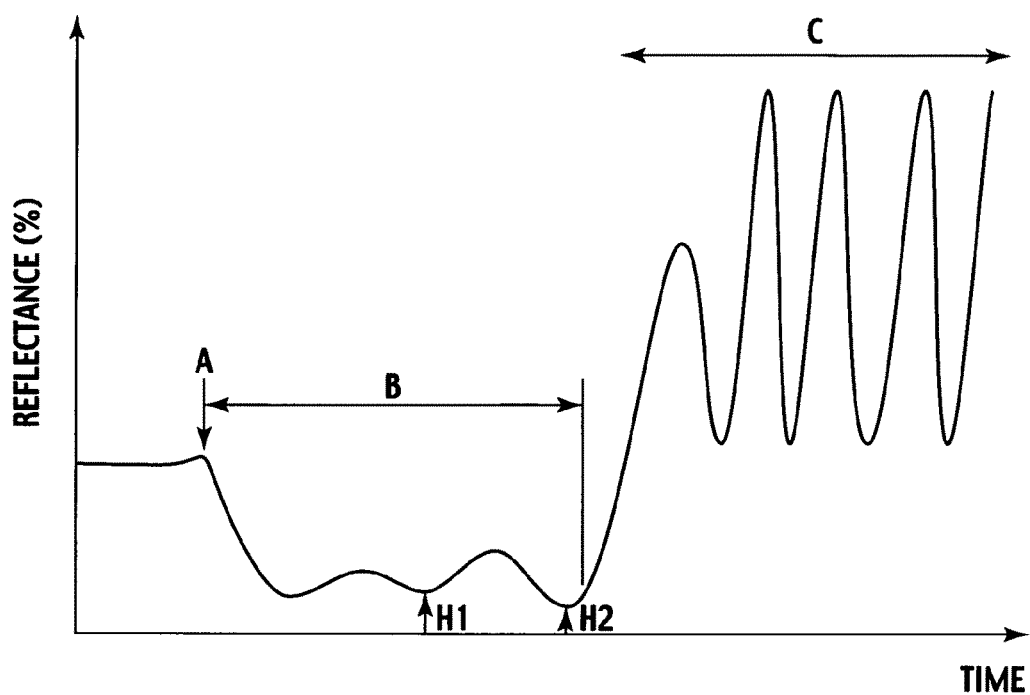
FIG. 9 is a schematic chart of the change in the reflectance of the surface of the semiconductor layer measured while the crystal of the semiconductor layer is being grown.

FIG. 9 shows what the values of the infrared reflectance stand for. The point A shown in FIG. 9 is the time when the crystal growth of the GaN-based laminate 40 is started. The reflectance until the growth of the GaN-based laminate 40 is started is approximately 8 to 9%. Then, the crystal growth of the first non-doped GaN layer 14 of the GaN-based laminate 40 is started at the point A. The period B represents the initial stage of the growth of the non-doped GaN layer 14. As the growth progresses and the film thickness increases, the reflectance oscillates, as in the period C, with a cycle equal to half the wavelength $\lambda$ used to monitor the reflectance. This is because, in the case of thin films formed on a substrate, the X-rays are reflected at the interface between layers of different electron densities (refractive indices); thus, interference occurs so as to generate, in the reflectance curve, an oscillation pattern with a cycle of $\lambda/2$. In addition, the initial stage of the growth of the non-doped GaN layer 14 of the GaN-based laminate 40 (period B) represents the total film thickness from the semiconductor layer that is next to the sapphire substrate 11 (growth substrate) to the non-doped GaN layer 14 that is in the process of crystal growth. To put it differently, the period B represents the sum of the film thickness of the AlN buffer layer 12, the film thickness of the non-doped GaN layer 13, and the film thickness of the non-doped GaN layer 14 that is in the process of crystal growth.

The cycle of the oscillating pattern, such as one observed in the period C that succeeds the period B, includes information on the film thickness, while the amplitude of the oscillating pattern includes information on the coarseness of the surfaces and the interfaces. With a coarse surface, the reflectance drastically drops down. Accordingly, the local minimal values, such as H1 and H2, of the oscillation of the reflectance in the period B were picked up, and the relationship between the surface state and the film thickness of the AlN buffer layer 12 were investigated. FIG. 10 shows the relationship in the case where the AlN buffer layer 12 has a film thickness of 46 Å.

FIG. 11 shows the relationship in the case where the AlN buffer layer 12 has a film thickness of 67 Å. FIG. 12 shows the relationship in the case where the AlN buffer layer 12 has a film thickness of 13 Å. The conditions under which the AlN buffer layers of a 46-Å film thickness and of a 13-Å film thickness were grown are the same as those described above. The AlN buffer layer of a 67-Å film thickness was grown under the same conditions as those for the AlN buffer layer of a 46-Å film thickness except that the period W was set at 3.6 seconds and L was set at 12 seconds.

Comparison of these FIGS. 10 to 12 reveals that the reflectance during the period B representing the initial stage of growth of the non-doped GaN layer 14 oscillates significantly in FIGS. 10 and 11 and reaches approximately 20%. The local minimal value during the period B reaches approximately 10% in each of FIGS. 10 and 11. In contrast, the oscillation of the reflectance in FIG. 12 is quite small from the time point of staring the growth, and the minimal value of the reflectance oscillations is 4% or smaller during the period B. As has been described thus far, forming a mirror-finished surface of the GaN layer that is grown on top of the AlN buffer layer by setting the film thickness of the AlN buffer layer at 20 Å or smaller is equivalent to making the minimum value of the reflectance oscillation of the light from the crystal-growth surface be 4% or smaller at the initial stage of growth for the GaN-based semiconductor layer crystal-grown on top of the GaN layer, that is, until the sum of the film thicknesses of the semiconductor layers starting from the growth substrate reaches 1 µm. A favorable device can be obtained by fabricating a nitride semiconductor element in this way.

The invention claimed is:

1. A method of manufacturing a nitride semiconductor in which a nitride semiconductor crystal is grown on top of an AlN buffer layer, comprising:
    forming the AlN buffer layer to have a film thickness of 20 Å or smaller, by starting supply of an Al-source material at a growth temperature of 900° C. or higher, and then supplying a N-source material intermittently and continuing to supply the Al-source material without interruption.

2. The method of manufacturing a nitride semiconductor according to claim 1, further comprising:
    performing a crystal growth process of a first GaN layer on top of the AlN buffer layer at a growth pressure of 150 Torr or higher and a growth temperature of 900° C. or higher.

3. The method of manufacturing a nitride semiconductor according to claim 2, further comprising:
    forming a second GaN layer on the first GaN layer, wherein a growth temperature of the second GaN layer is greater than the growth temperature of the first GaN layer and a growth pressure of the second GaN layer is smaller than the growth pressure of the first GaN layer.

4. The method of manufacturing a nitride semiconductor according to claim 1, wherein a principal plane for growth on the growth substrate is an M-plane.

5. The method of manufacturing a nitride semiconductor according to claim 1, wherein a number of repetitions of an ON-OFF cycle for the supply of the Al-source material is one or more.

6. The method of manufacturing a nitride semiconductor according to claim 1, wherein the Al-source material is trimethylgallium (TMA) and the N-source material is ammonia ($NH_3$).

7. The method of manufacturing a nitride semiconductor according to claim 1, further comprising:

setting the growth temperature of the AlN buffer layer in a range from 1000° C. to 1100° C.; and forming a GaN layer on the AlN buffer layer at a temperature in a range from 1000° C. to 1100° C.

\* \* \* \* \*